United States Patent
Tunks et al.

(10) Patent No.: US 11,925,003 B2
(45) Date of Patent: Mar. 5, 2024

(54) HEATING OR COOLING APPARATUS-INTEGRATED HEAT SINK FOR A COMPUTING DEVICE

(71) Applicant: Dell Products L.P., Round Rock, TX (US)

(72) Inventors: Eric Michael Tunks, Austin, TX (US); Joseph Andrew Vivio, Seattle, WA (US); Tyler Baxter Duncan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 2 days.

(21) Appl. No.: 17/576,700

(22) Filed: Jan. 14, 2022

(65) Prior Publication Data

US 2023/0232590 A1 Jul. 20, 2023

(51) Int. Cl.
*H05K 7/20* (2006.01)
*G06F 1/20* (2006.01)
*H01L 23/38* (2006.01)
*H05K 1/02* (2006.01)

(52) U.S. Cl.
CPC ......... *H05K 7/20509* (2013.01); *G06F 1/206* (2013.01); *H01L 23/38* (2013.01); *H05K 1/0203* (2013.01); *H05K 7/20409* (2013.01); *H05K 7/20718* (2013.01)

(58) Field of Classification Search
CPC ........... H05K 7/20409; H05K 7/20509; H05K 7/20718; H05K 7/20854; H05K 7/209; H01L 23/38; H01K 1/0203
See application file for complete search history.

(56) References Cited

U.S. PATENT DOCUMENTS

| | | | | | |
|---|---|---|---|---|---|
| 5,456,081 | A | * | 10/1995 | Chrysler | H10N 10/13 165/185 |
| 5,829,512 | A | * | 11/1998 | August | H01L 21/4878 257/E23.105 |
| 6,798,659 | B2 | * | 9/2004 | Chen | H01L 23/38 361/704 |
| 7,367,195 | B2 | * | 5/2008 | Sauciuc | H01L 23/38 257/E23.087 |
| 2013/0118718 | A1 | * | 5/2013 | Chang | F28D 15/0275 165/104.26 |
| 2013/0239591 | A1 | * | 9/2013 | Clarkson | F25B 21/02 438/54 |
| 2019/0150316 | A1 | * | 5/2019 | Dayal | G06F 1/3296 361/679.48 |
| 2020/0382151 | A1 | * | 12/2020 | Pine | G06F 1/1656 |
| 2020/0409401 | A1 | * | 12/2020 | Berge | H05K 7/20836 |
| 2021/0359190 | A1 | * | 11/2021 | Maeshima | H01L 23/36 |
| 2022/0061187 | A1 | * | 2/2022 | Shao | H05K 7/20409 |

* cited by examiner

*Primary Examiner* — Zachary Pape
(74) *Attorney, Agent, or Firm* — Chamberlain, Hrdlicka, White, Williams, & Aughtry; Aly Z. Dossa (57) ABSTRACT

A computing device includes a heat dissipation component, a heating or cooling apparatus, and a printed circuit board. The heating or cooling apparatus includes a heating or cooling component and a wire, and the heating or cooling component is affixed to a surface of the heat dissipation component. The printed circuit board includes a printed circuit board component, and the heat dissipation component is affixed to the printed circuit board component and configured to heat or cool the printed circuit board component.

18 Claims, 8 Drawing Sheets

ABSTRACT# HEATING OR COOLING APPARATUS-INTEGRATED HEAT SINK FOR A COMPUTING DEVICE

BACKGROUND

Computing devices may perform services. In order to provide the services, the computing devices may include hardware components and software components. The software components may utilize the hardware components to provide the services.

SUMMARY

In general, in one aspect, the invention relates to a computing device. The computing device includes a heat dissipation component, a heating or cooling apparatus, and a printed circuit board. The heating or cooling apparatus includes a heating or cooling component and a wire, and the heating or cooling component is affixed to a surface of the heat dissipation component. The printed circuit board includes a printed circuit board component, and the heat dissipation component is affixed to the printed circuit board component and configured to heat or cool the printed circuit board component.

In general, in one aspect, the invention relates to an information handling system including a cabinet housing a plurality of computing devices. Each computing device incudes a heat dissipation component, a heating or cooling apparatus, and a printed circuit board. The heating or cooling apparatus includes a heating or cooling component and a wire, and the heating or cooling component is affixed to a surface of the heat dissipation component. The printed circuit board includes a printed circuit board component, and the heat dissipation component is affixed to the printed circuit board component and configured to heat or cool the printed circuit board component.

In general, in one aspect, the invention relates to a method for heating or cooling hardware components in a computing device. The method for heating or cooling the hardware components in the computing device may include determining a heating or cooling condition of the computing device; in response to determination, initiating heating or cooling of a hardware component of the computing device using a heating or cooling component, wherein the heating or cooling component is affixed to a surface of a heat dissipation component within the computing device.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 3.1 shows a diagram of a portion of a computing device in accordance with one or more embodiments of the invention.

FIG. 3.2 shows a diagram of a portion of a computing device in accordance with one or more embodiments of the invention.

FIG. 3.3 shows a diagram of a portion of a computing device in accordance with one or more embodiments of the invention.

FIG. 3.4 shows a diagram of a portion of the computing device of FIG. 3.1 in accordance with one or more embodiments of the invention.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information and/or power may travel may be considered an operative connection.

Computing devices may include any number of hardware components that facilitate providing the services of the computing devices. The hardware components may include, for example, processors, non-persistent storage drives, persistent storage drives, circuit cards that interconnect these components, etc. In some cases, computing devices might be deployed in environments that result in the temperature of the computing devices being outside of their designed operating temperature range. For example, the computing devices may be designed to operate at temperatures above 0° C. When the computing devices are deployed to harsh environmental conditions (e.g., −40° C.-60° C.), the computing devices may not operate properly and, in certain scenarios, may be damaged.

To address one or more of the aforementioned issues, embodiments of the invention provide a heating or cooling mechanism to heat or cool a printed circuit board component in a computing device to a temperature that is within its designed operating temperature range. More specifically, embodiments of the invention include a heating or cooling component that is affixed to a surface of a heat dissipation component. The heating or cooling component enables targeted heating or cooling of the printed circuit board component without taking up valuable space within the computing device.

Various embodiments of the computing device are described below.

Figure 1:
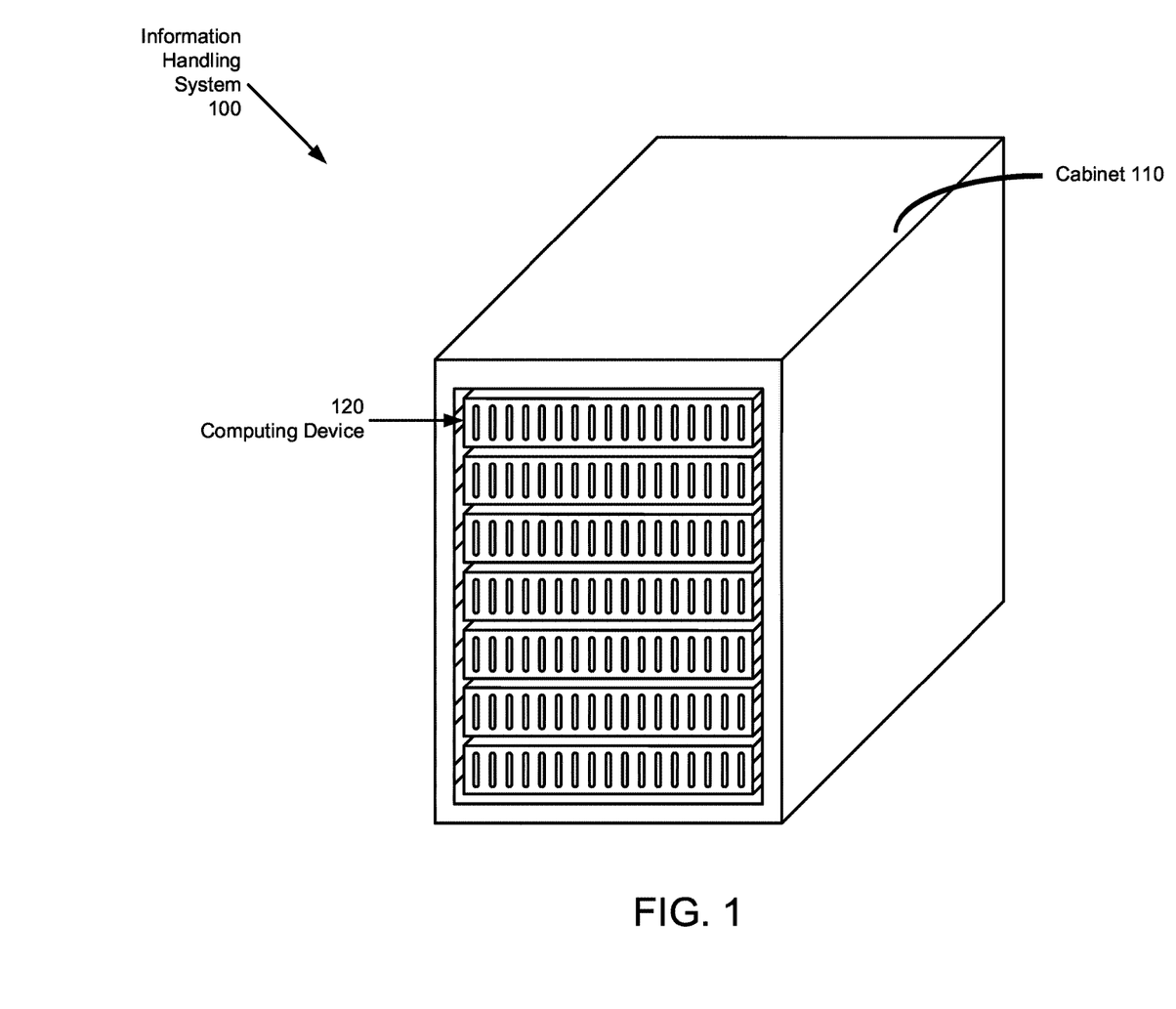
FIG. 1 shows a diagram of an information handling system in accordance with one or more embodiments of the invention.

FIG. 1 shows a diagram of an information handling system (100) in accordance with one or more embodiments of the invention. The system may include a cabinet (110) and any number of computing devices (e.g., 120).

The cabinet (110) may be a mechanical structure that enables computing devices (e.g., 120) to be positioned with respect to one another. For example, the cabinet (110) may be a rack mountable enclosure that enables the computing devices (e.g., 120) to be disposed within it. The cabinet (110) may be implemented as other types of structures adapted to house, position, orient, and/or otherwise physically, mechanically, electrically, and/or thermally manage the computing devices (e.g., 120). By managing the computing devices (e.g., 120), the cabinet (110) may enable multiple computing devices to be densely packed in a space without negatively impacting the operation of the information handling system (100).

A computing device (e.g., 120) may be a mechanical structure for housing components of the information handling system (100). For example, the computing device (e.g., 120) may be implemented as a rack mountable enclosure for housing components of the information handling system. The computing device (e.g., 120) may be adapted to be disposed within the cabinet (110) and/or utilize services provided by the cabinet (110) and/or other devices.

To provide services, the computing device (e.g., 120) may utilize computing device resources provided by hardware components. The hardware components may include, for example, processors, non-persistent storage drives, a printed circuited board(s), persistent storage drives, special purpose hardware, and/or other types of physical components that contribute to the operation of the computing device.

Figure 2:
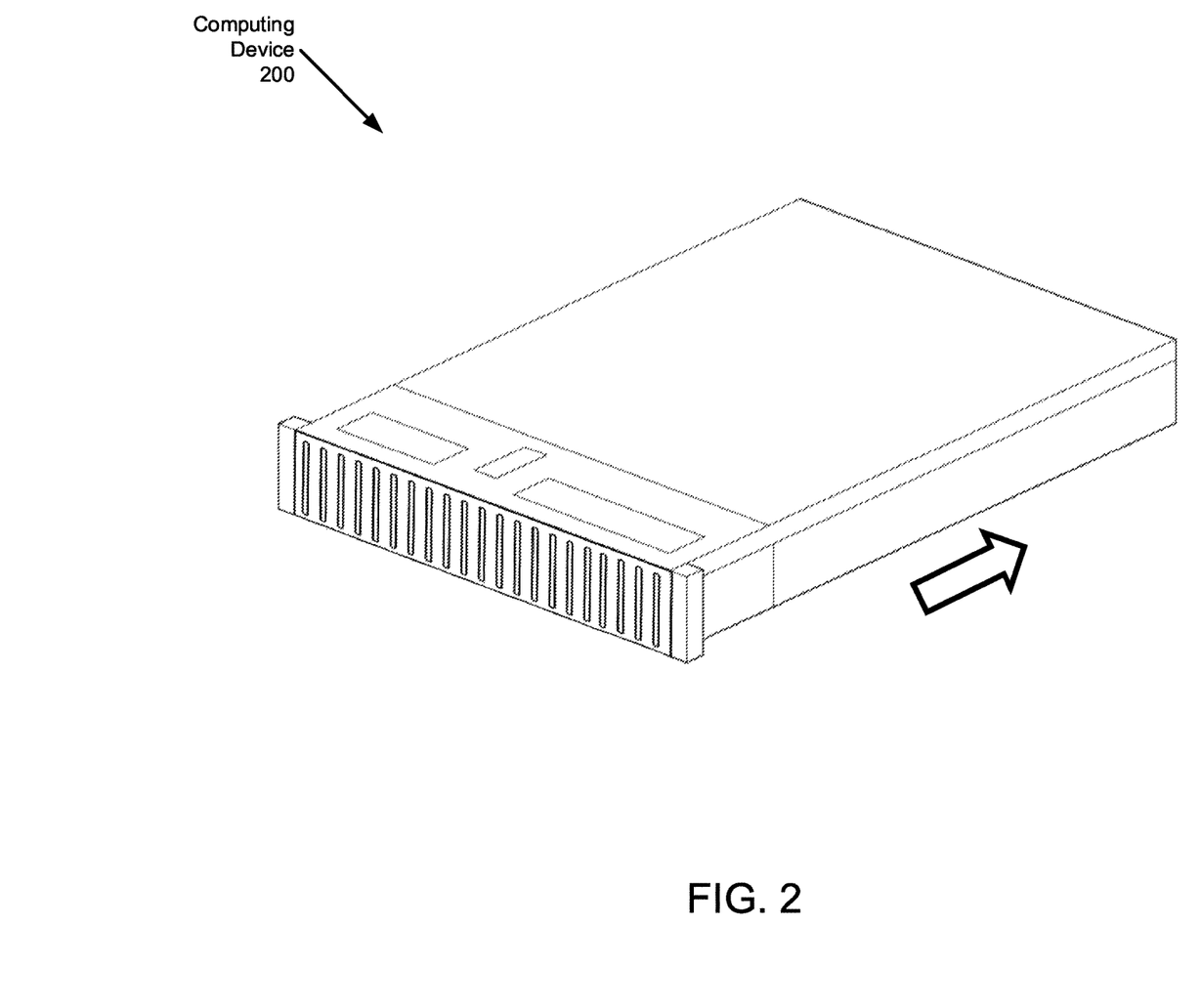
FIG. 2 shows a diagram of a computing device in accordance with one or more embodiments of the invention.

Turning now to FIG. 2, FIG. 2 shows a diagram of a computing device (200) in accordance with one or more embodiments of the invention. In one or more embodiments of the invention, the computing device includes six sides (i.e., top, bottom, right, left, front, and back), where air drawn into from the frontside of the computing device and expelled from the backside of the computing device (airflow direction is shown with an arrow). In general, air incoming from the frontside of the computing device is cooler than air outgoing from the backside of the computing device.

In one or more embodiments of the invention, to provide services, the computing device (200) may utilize computing device resources provided by a number of hardware components housed within the computing device. The number of hardware components may include, for example, persistent storage drives (not shown), non-persistent storage drives (not shown), processors (not shown), peripheral component interconnects (not shown), a printed circuit board (not shown), and/or other types of physical components that contribute to the operation of the computing device (200). Some examples of the hardware components are shown in FIGS. 3.1-3.3 and 4, but the examples of the hardware components are not limited to those shown in FIGS. 3.1-3.3 and 4. In other embodiments of the invention, one or more of the hardware components may be omitted or additional hardware components may be added based on the services provided by the computing device.

Figure 31:
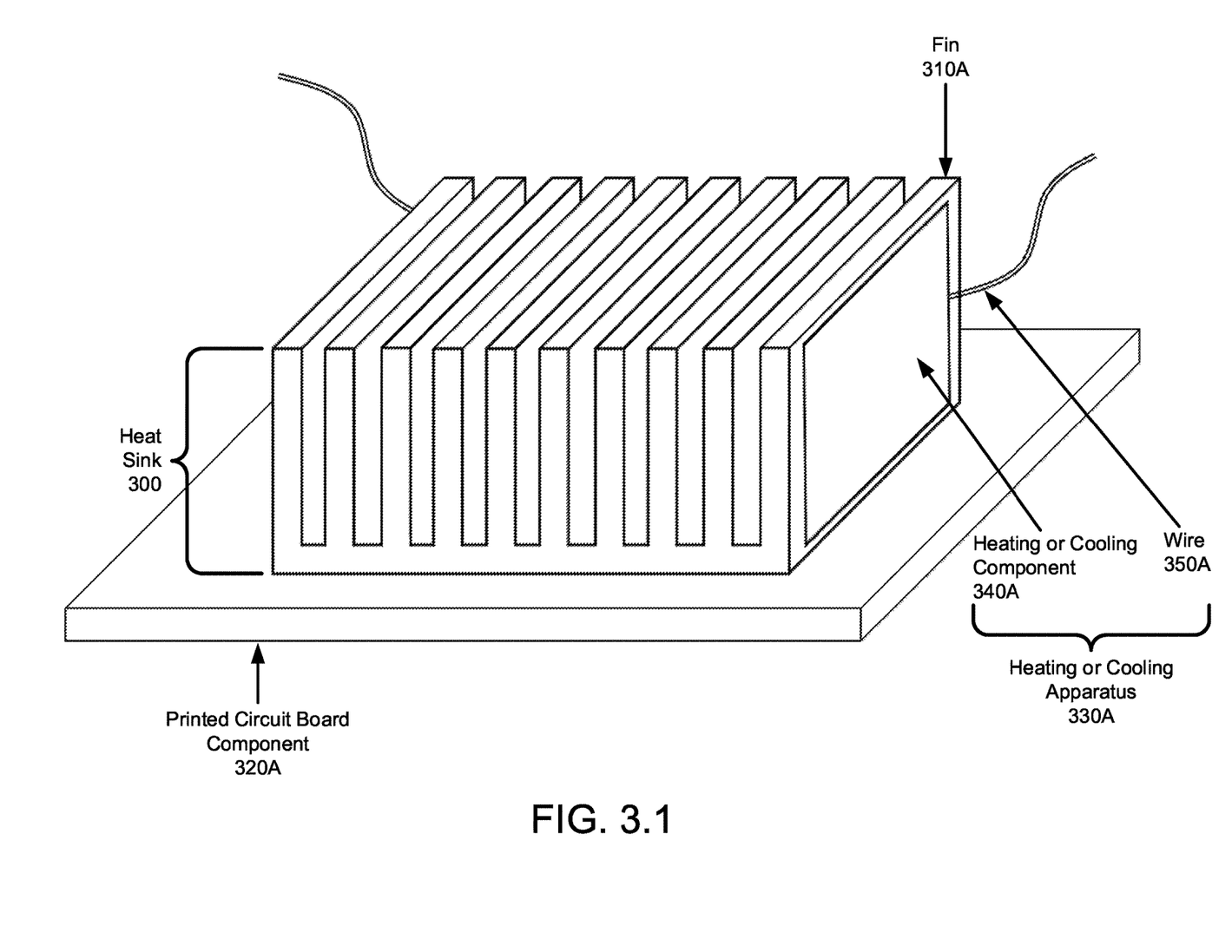
Figure 32:
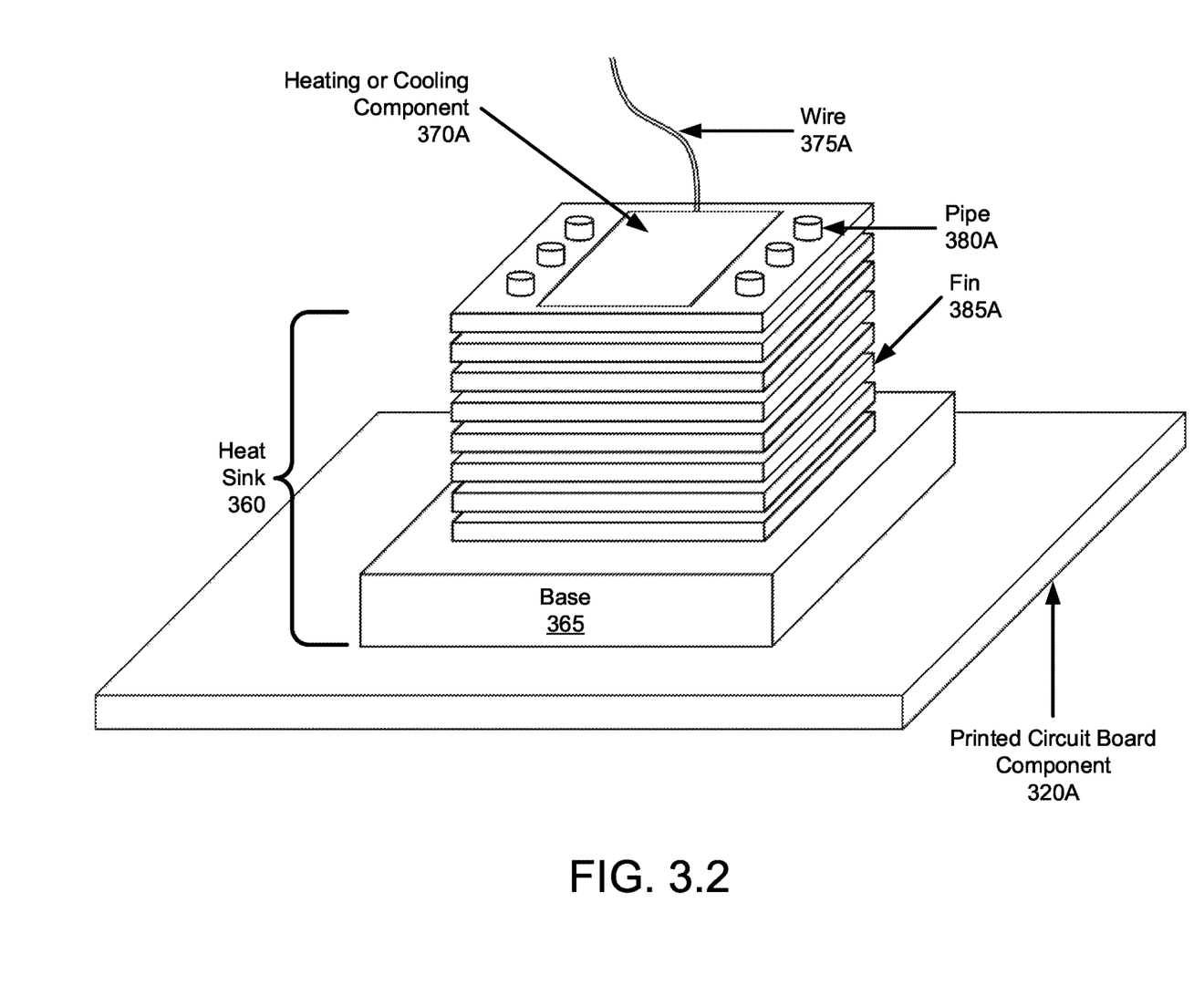
Figure 33:
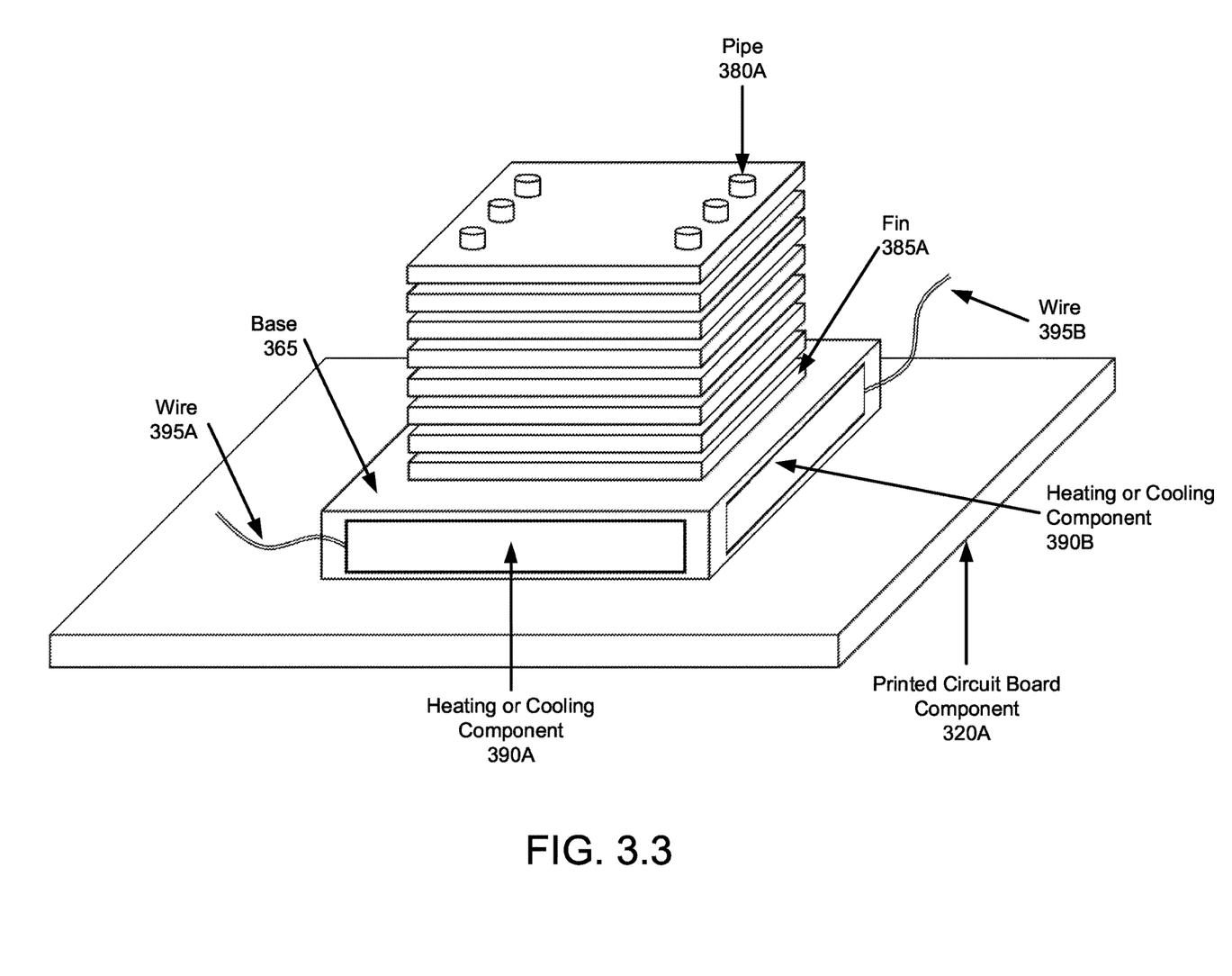

FIGS. 3.1-3.3 show different embodiments to employ a heating or cooling apparatus-integrated heat sink in a computing device in accordance with one or more embodiments disclosed below.

Turning now to FIG. 3.1, FIG. 3.1 shows a diagram of a portion of a computing device in accordance with one or more embodiments of the invention. In one or more embodiments of the invention, the diagram of the portion of the computing device includes a heat sink (300), where the heat sink includes a base (not shown) and a fin (e.g., 310A), a printed circuit board component (e.g., 320A), and a heating and cooling apparatus (e.g., 330A) in which the heating and cooling apparatus includes a heating or cooling component (e.g., 340A) and a wire (e.g., 350A).

In an embodiment of the invention shown in FIG. 3.1, the printed circuit board component (e.g., 320A) is a hardware component, e.g., a processor, a persistent storage device, a special purpose hardware, etc., that contributes to the operation of the computing device (e.g., 200, FIG. 2).

In an embodiment of the invention shown in FIG. 3.1, the heat sink (300) is affixed to the printed circuit board component (e.g., 320A). In one or more embodiments of the invention, the fin (e.g., 310A) includes six sides (e.g., top, bottom, right, left, front, and back), where the bottomside of the fin is affixed to the base of the heat sink. The heating or cooling component (e.g., 340A) is affixed to one of the side surfaces of the fin (e.g., 310A), and both the fin and the heating or cooling component are oriented orthogonally to the printed circuit board component (e.g., 320A).

In one embodiment of the invention, when a current temperature of the printed circuit board component (e.g., 320A) is below a first threshold, see Step 500 of FIG. 5, (e.g., if the operatingtemperature range is 0° C.-40° C., then the threshold may be −1° C.), the heating or cooling component (e.g., 340A) is powered along a direction (e.g., a heating power direction) to heat the fin (e.g., 310A), and the induced heat is transferred from the fin to the printed circuit board component primarily via thermal conduction (see Step 502 of FIG. 5).

Figure 5:
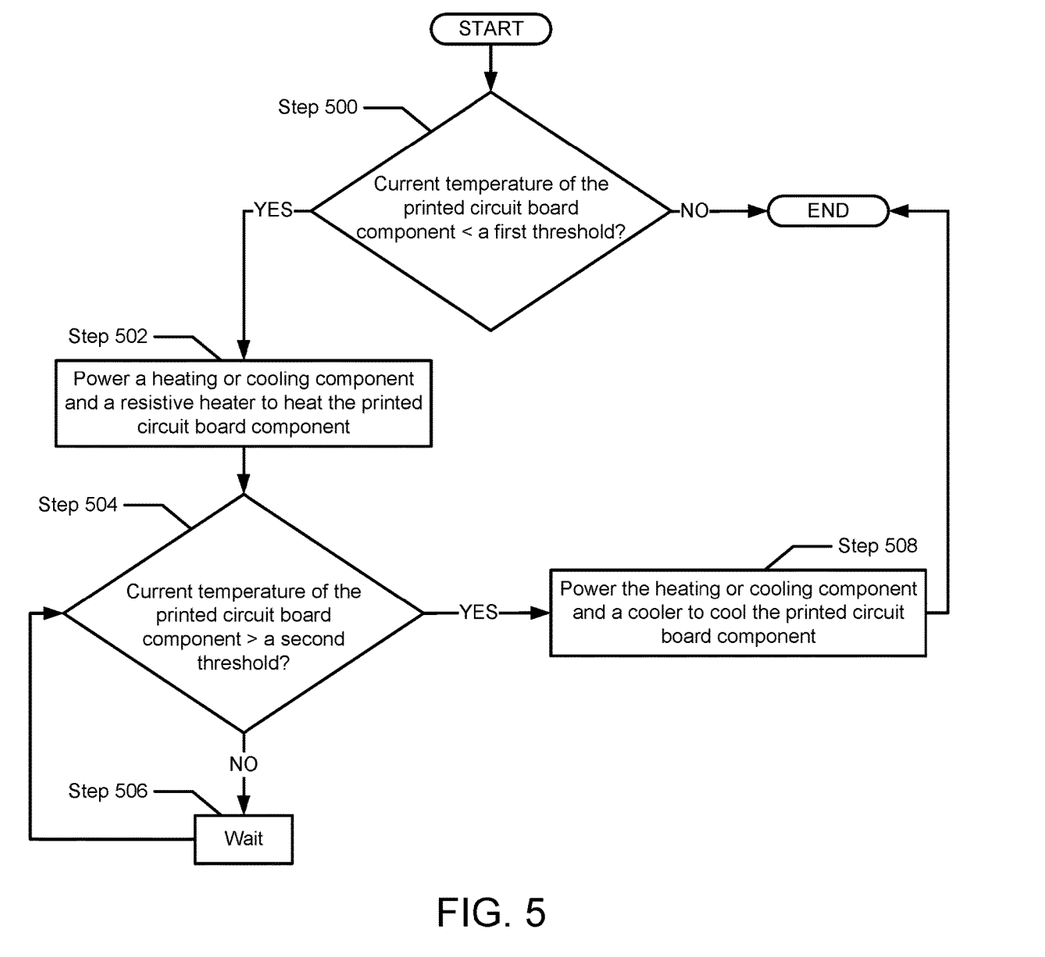
FIG. 5 shows a flowchart of a method for managing a temperature of a printed circuit board component in accordance with one or more embodiments of the invention.

In one embodiment of the invention, when the current temperature of the printed circuit board component (e.g., 320A) is above a second threshold, see Step 504 of FIG. 5, (e.g., if the operating temperature range is 0° C.-40° C., then the threshold may be 41° C.), the heating or cooling component (e.g., 340A) is powered along a direction opposite to the heating power direction (e.g., by changing voltage polarity) to cool the fin (e.g., 310A) and the printed circuit board component (e.g., 320A) mostly via thermal conduction (see Step 508 of FIG. 5). While any excess thermal energy is leaving the printed circuit board component (e.g., 320A) through the heat sink (300), this approach will further boost the thermal energy dissipation of the printed circuit board component.

Figure 34:
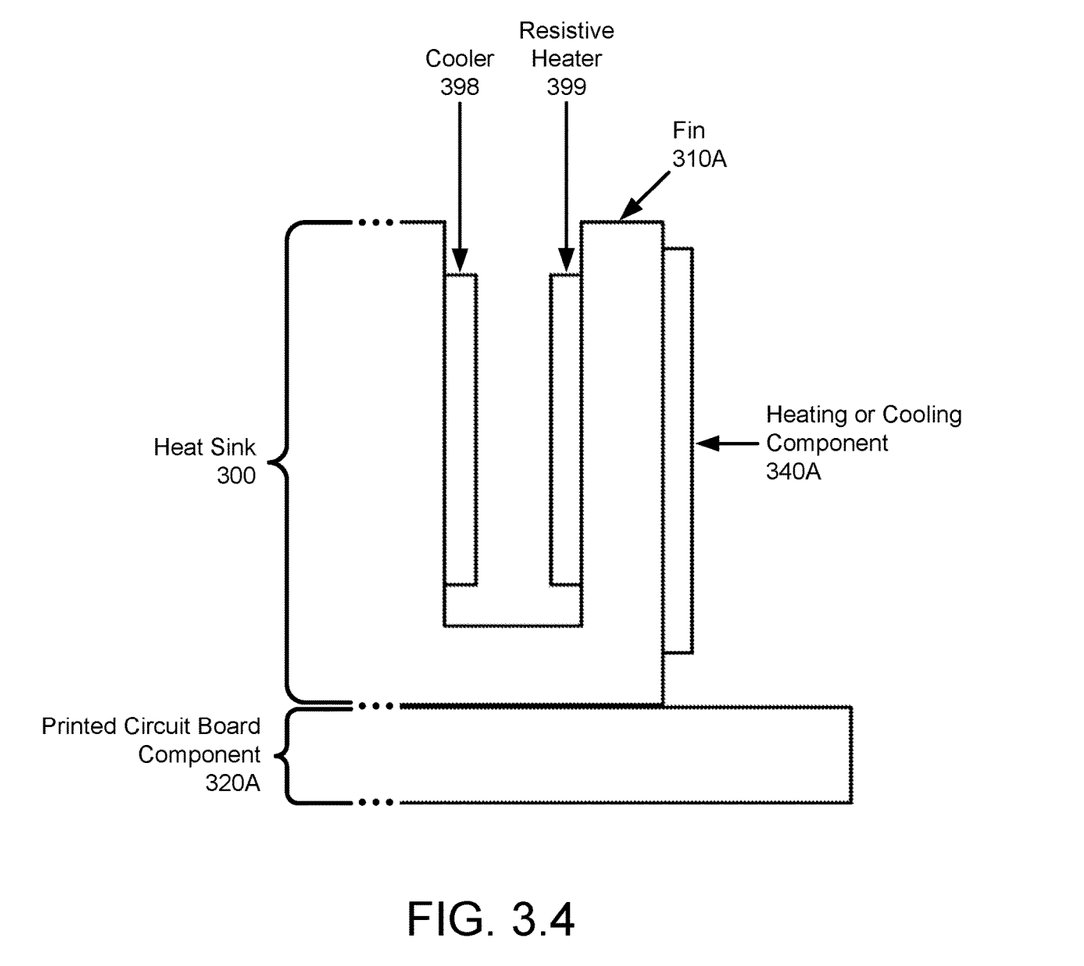

In one embodiment of the invention, a resistive heater (SEE, E.G., 399, FIG. 3,4) and a cooler (see, e.g., 398, FIG. 3,4) can be affixed to one of the side surfaces of the heat sink (300), and the fin (e.g., 310A), resistive heater, and cooler can be oriented orthogonally to the printed circuit board component (e.g., 320A). When the current temperature of the printed circuit board component (e.g., 320A) is below the first threshold, see Step 500 of FIG. 5, (e.g., if the operating temperature range is 0° C.-40° C., then the threshold may be −1° C.), the resistive heater can be powered to heat the heat sink (300) and the induced heat can be transferred from the fin to the printed circuit board component (e.g., 320A) primarily via thermal conduction (see Step 502 of FIG.5). Further, when the current temperature of the printed circuit board component (e.g., 320A) is above the second threshold, see Step 504 of FIG. 5, (e.g., if the operating temperature range is 0° C.-40° C., then the threshold may be 41° C.), the cooler can be powered to cool the heat sink (300) and the printed circuit board component primarily via thermal conduction (see Step 508 of FIG. 5).

Those skilled in the art will appreciate that while the heat sink (300) is shown that it is affixed to the printed circuit board component (e.g., 320A), the heat sink may be placed on a hardware component which is located inside the computing device (e.g., 200, FIG. 2), but not affixed to the printed circuit board component without departing from the invention.

In one or more embodiments of the invention, the resistive heater and the cooler may be made of silicon rubber, polyimide film, any other material, and/or any combination thereof that enables the resistive heater and the cooler to perform the functions described herein.

In one or more embodiments of the invention, the heating or cooling component (e.g., 340A) may be a thermoelectric cooler, any other component, and/or any combination thereof that enables the heating or cooling component to perform the functions described herein. In one or more embodiments of the invention, the heating or cooling component (e.g., 340A) can be affixed to the fin (e.g., 310A) using, for example, pressure sensitive adhesive. Further, the heating or cooling component (e.g., 340A) has sufficient thickness and compliance such that it fits within the gaps between each fin, and it does not block airflow within the computing device (e.g., 200, FIG. 2).

In one or more embodiments of the invention, when the temperature of the printed circuit board component (e.g., 320A) is brought to its designed operating temperature range, the printed circuit board component may continue to operate in the harsh environmental conditions. The stability and functionality of the computing device (e.g., 200, FIG. 2) may be improved. When equilibrium operation conditions are present (e.g., the heating or cooling component (e.g., 340A) is off), the heat sink (300) can be used for its conventional purpose. For example, when necessary, any excess thermal energy may leave the printed circuit board component (e.g., 320A) through the heat sink (300), where the surface area of the printed circuit board component is enlarged (e.g., by the surface area of the fins on the heat sink) for faster thermal energy dissipation.

Those skilled in the art will appreciate that while the heating or cooling component (e.g., 340A) is shown that it is located on the heat sink (300), it may be placed between the heat sink and the printed circuit board component (e.g., 320A) without departing from the invention.

Turning now to FIG. 3.2, FIG. 3.2 shows a diagram of a portion of a computing device in accordance with one or more embodiments of the invention. In one or more embodiments of the invention, the diagram of the portion of the computing device includes a printed circuit board component (e.g., 320A), a heat sink (360) where the heat sink includes a base (365) and a fin (e.g., 385A), a heating or cooling apparatus (not shown) in which the heating or cooling apparatus includes a heating or cooling component (e.g., 370A) and a wire (e.g., 375A), and a pipe (e.g., 380A).

In one embodiment of the invention, the base of the heat sink (365) is affixed to the printed circuit board component (e.g., 320A). The heating or cooling component (e.g., 370A) is affixed to one of the side surfaces of the fin (e.g., 385A), and both the fin and the heating or cooling component are oriented in parallel to the printed circuit board component (e.g., 320A). Further, when a current temperature of the printed circuit board component (e.g., 320A) is below a threshold (e.g., if the operating temperature range is 0° C.-40° C., then the threshold may be −1° C.), the heating or cooling component (e.g., 370A) is powered along the heating power direction to heat the printed circuit board component through the pipe (e.g., 380A). A base of the pipe (not shown) is affixed to the base of the heat sink (365) and the induced heat transferred from the base of the pipe to the base of the heat sink mostly via thermal conduction. Eventually, heat will be transferred, primarily via thermal conduction, from the base of the heat sink (365) to the printed circuit board component (e.g., 320A).

In one embodiment of the invention, when the current temperature of the printed circuit board component (e.g., 320A) is above a threshold (e.g., if the operating temperature range is 0° C.-40° C., then the threshold may be 41° C.), the heating or cooling component (e.g., 370A) is powered along a direction opposite to the heating power direction (e.g., by changing voltage polarity) to cool the fin (e.g., 385A) and printed circuit board component through the pipe (e.g., 380A). While any excess thermal energy is leaving the printed circuit board component (e.g., 320A) through the heat sink, this approach will further boost the thermal energy dissipation of the printed circuit board component.

In one embodiment of the invention, a resistive heater (not shown) and a cooler (not shown) can be affixed to one of the side surfaces of the fin (e.g., 385A), and the fin, resistive heater, and cooler can be oriented in parallel to the printed circuit board component (e.g., 320A). When the current temperature of the printed circuit board component (e.g., 320A) is below a threshold (e.g., if the operating temperature range is 0° C.-40° C., then the threshold may be −1° C.), the resistive heater can be powered to heat the fin (e.g., 385A) and the induced heat can be transferred from the base of the pipe to the base of the heat sink (e.g., 365) primarily via thermal conduction. Eventually, heat will be transferred, primarily via thermal conduction, from the base of the heat sink (365) to the printed circuit board component (e.g., 320A).

Further, when the current temperature of the printed circuit board component (e.g., 320A) is above a threshold (e.g., if the operating temperature range is 0° C.-40° C., then the threshold may be 41° C.), the cooler can be powered to further cool the fin (e.g., 385A) and the printed circuit board component primarily via thermal conduction.

In one or more embodiments of the invention, the pipe (e.g., 380A) may be made of copper, any other material that has high thermal conductivity and low specific heat capacity, and/or any combination thereof that enables the pipe to perform the functions described herein. In one or more embodiments of the invention, the pipe (e.g., 380A) has sufficient thickness to host a working fluid (e.g., water) and it provides rapid heat transfer away from a heat source. For example, in the embodiment of the invention shown in FIG. 3.2, when the harsh environmental conditions are present (e.g., the heating or cooling component (e.g., 370A) is on), it can transfer the induced heat from the heating or cooling component to the base of the heat sink (365).

Further, when equilibrium operation conditions are present (e.g., the heating or cooling component (e.g., 370A) is off), the pipe (e.g., 380A) can transfer heat from the base of the heat sink (365) to the fin (e.g., 385A) (i.e., removing heat from the base of the heat sink) to cool the printed circuit board component (e.g., 320A).

Those skilled in the art will appreciate that while the heating or cooling component (e.g., 370A) is shown that it is located on the heat sink (360), it may be placed between the heat sink and the printed circuit board component (e.g., 320A) without departing from the invention.

Turning now to FIG. 3.3, FIG. 3.3 shows a diagram of a portion of a computing device in accordance with one or more embodiments of the invention. In one or more embodiments of the invention, the diagram of the portion of the computing device includes a printed circuit board component (e.g., 320A), a base of a heat sink (365), a pipe (e.g., 380A), a fin (e.g., 385A), a heating or cooling apparatus (not shown) where the heating or cooling apparatus includes a heating or cooling component (e.g., 390A, 390B) and a wire (e.g., 395A, 395B).

In one embodiment of the invention, the base of the heat sink (365) is affixed to the printed circuit board component (e.g., 320A). The base of the heat sink (365) includes six sides (e.g., top, bottom, right, left, front, and back), where the bottomside of the base of the heat sink is affixed to the printed circuit board component (e.g., 320A). The heating or cooling component (e.g., 390A, 390B) is affixed to one of the side surfaces of the base of the heat sink (365), where the heating or cooling component is oriented orthogonally to the printed circuit board component (e.g., 320A).

When a current temperature of the printed circuit board component (e.g., 320A) is below a threshold (e.g., if the operating temperature range is 0° C.-40° C., then the threshold may be −1° C.), the heating or cooling component (e.g., 390A, 390B) is powered along the heating power direction to heat the printed circuit board component through the pipe (e.g., 380A). A base of the pipe (not shown) is affixed to the base of the heat sink (365) and the induced heat transferred from the base of the pipe to the base of the heat sink primarily via thermal conduction. Eventually, heat will be transferred, primarily via thermal conduction, from the base of the heat sink (365) to the printed circuit board component (e.g., 320A).

Further, in one embodiment of the invention, when the current temperature of the printed circuit board component (e.g., 320A) is above a threshold (e.g., if the operating temperature range is 0° C.-40° C., then the threshold may be 41° C.), the heating or cooling component (e.g., 390A, 390B) is powered along a direction opposite to the heating power direction (e.g., by changing voltage polarity) to cool the fin (e.g., 385A) and printed circuit board component through the pipe (e.g., 380A). While any excess thermal energy is leaving the printed circuit board component (e.g., 320A) through the heat sink, this approach will further boost the thermal energy dissipation of the printed circuit board component.

In one embodiment of the invention, a resistive heater (not shown) and a cooler (not shown) can be affixed to one of the side surfaces of the base of the heat sink (365). While the fin (e.g., 385A) is oriented in parallel to the printed circuit board component (e.g., 320A), the resistive heater and the cooler can be oriented orthogonally to the printed circuit board component. When the current temperature of the printed circuit board component (e.g., 320A) is below a threshold (e.g., if the operating temperature range is 0° C.-40° C., then the threshold may be −1° C.), the resistive heater can be powered to heat the base of the heat sink (365) primarily via thermal conduction. Eventually, heat will be transferred, primarily via thermal conduction, from the base of the heat sink (365) to the printed circuit board component (e.g., 320A).

Further, when the current temperature of the printed circuit board component (e.g., 320A) is above a threshold (e.g., if the operating temperature range is 0° C.-40° C., then the threshold may be 41° C.), the cooler can be powered to cool the base of the heat sink (365), the fin (e.g., 385A) via the pipe (e.g., 380A), and the printed circuit board component primarily via thermal conduction.

In one or more embodiments of the invention, when the temperature of the printed circuit board component (e.g., 320A) is brought to its designed operating temperature range, the printed circuit board component may continue to operate in the harsh environmental conditions. Further, when equilibrium operation conditions are present (e.g., the heating or cooling component (e.g., 390A, 390B) is off), the base of the heat sink (365), the fin (e.g., 385A), and the pipe (e.g., 380A) can be used for their conventional purpose. For example, when necessary, any excess thermal energy may leave the printed circuit board component (e.g., 320A) through them, where the surface area of the printed circuit board component is enlarged for faster thermal energy dissipation.

Those skilled in the art will appreciate that while the heating or cooling component (e.g., 390A, 390B) is shown that it is located on the base of the heat sink (365), it may be placed between the base of the heat sink and the printed circuit board component (e.g., 320A) without departing from the invention.

The various heat sink embodiments shown in FIGS. 3.1-3.3 may be collectively referred to as heat dissipation components.

Figure 4:
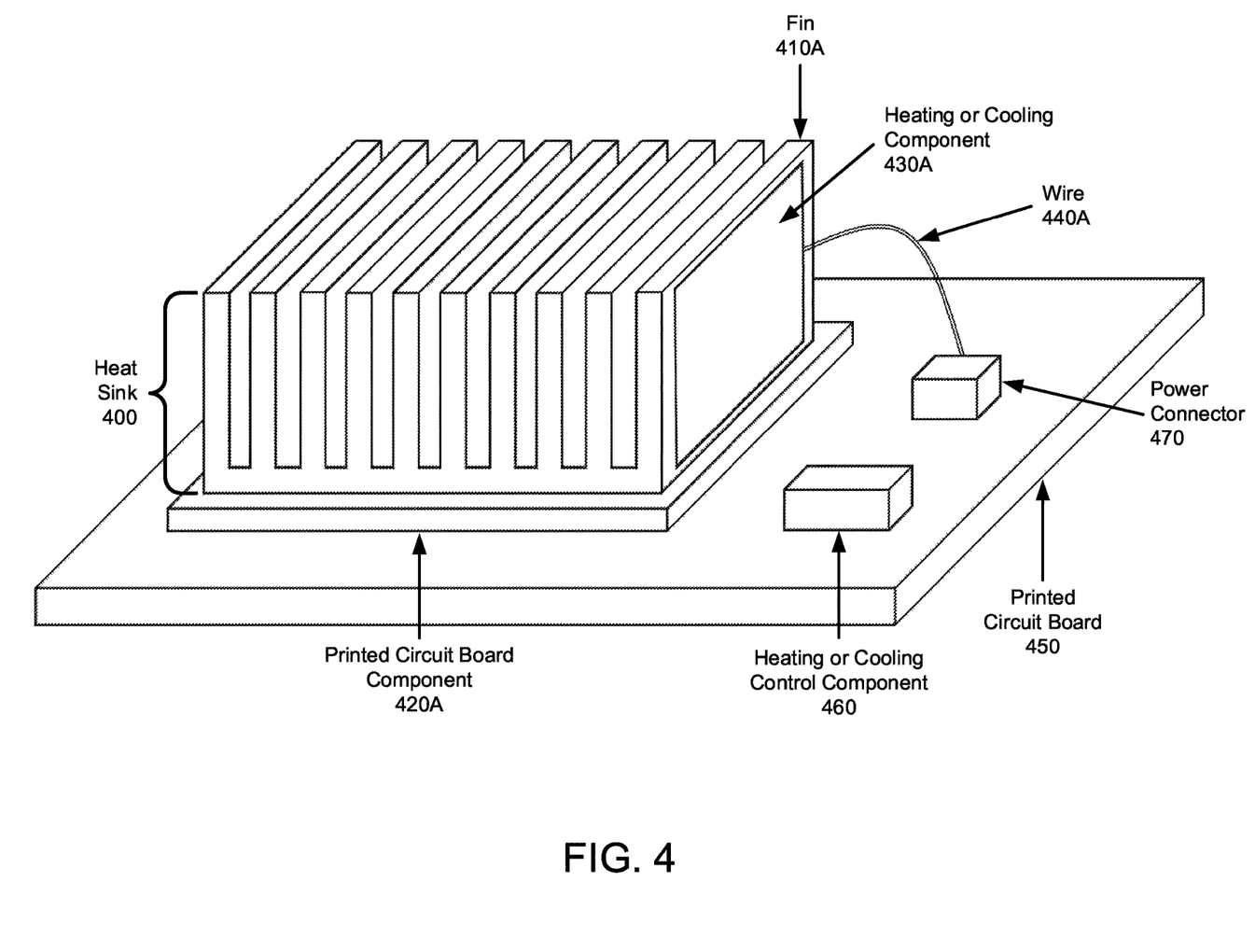
FIG. 4 shows a diagram of a portion of a computing device in accordance with one or more embodiments of the invention.

Turning now to FIG. 4, FIG. 4 shows a diagram of a portion of a computing device in accordance with one or more embodiments of the invention. In one or more embodiments of the invention, the diagram of the portion of the computing device includes a heat sink (400) where the heat sink includes a base (not shown) and a fin (e.g., 410A), a printed circuit board component (e.g., 420A), a heating or cooling apparatus (not shown) in which the heating or cooling apparatus includes a heating or cooling component (e.g., 430A) and a wire (e.g., 440A), a printed circuit board (450), a heating or cooling control component (460), a power connector (470), and a temperature sensor (not shown).

In one or more embodiments of the invention, the heating or cooling control component (460) may provide heating or cooling control services. The heating or cooling control services may include (i) obtaining information regarding the temperature of one or more hardware components within the computing device (e.g., 200, FIG. 2), where the information may be obtained through the temperature sensor, (ii) determining a heating condition, e.g., determining whether the temperature within the computing device is below the appropriate operating temperature range (e.g., whether the temperature is below 0° C.), (iii) determining a cooling condition, e.g., determining whether the temperature within the computing device is above the appropriate operating temperature range (e.g., whether the temperature is below 40° C.), (iv) initiating a heating process to bring the hardware components of the computing device into their designed operating temperature range, (v) initiating a cooling process to bring the hardware components of the computing device into their designed operating temperature range, (vi) preventing damage (e.g., thermal runaway) to the heating or cooling component in the event of overheating, and (vii) preventing damage to the heating or cooling component in the event of freezing.

While described as a physical structure, the heating or cooling control component (460) may be implemented as a logical entity (e.g., a program executing using the printed circuit board component (e.g., 420A)). For example, the computing device (e.g., 200, FIG. 2) may host a program that provides the functionality of the heating or cooling control component (460).

In one or more embodiments of the invention, one end of the temperature sensor is operatively connected to the heating or cooling control component (460), while the other end of the temperature sensor operatively connected to at least one hardware component within the computing device (e.g., 200, FIG. 2) and configured to detect a temperature within the computing device. When the temperature within the computing device (e.g., 200, FIG. 2) is below or above a threshold, the heating or cooling control component (460) is configured to initiate the activation of the heating or cooling component (e.g., 430A) based on the input from the temperature sensor.

In one or more embodiments of the invention, when the heating or cooling control component (460) determines the temperature within the computing device (e.g., 200, FIG. 2) is below or above the appropriate operating temperature range, it may instruct the power connector (470) to provide power to the heating or cooling component (e.g., 430A).

Those skilled in the art will appreciate that while the heating or cooling control component (460) and the power connector (470) are shown that they are located adjacent to the printed circuit board component (e.g., 420A), those components may be placed at any location within the computing device (e.g., 200, FIG. 2) without departing from the invention.

Continuing the discussion of FIG. 4, in one or more embodiments of the invention, the heating or cooling component (e.g., 430A) operatively connected to the power connector (470), where the heating or cooling component receives power via the power connector. In one or more embodiments of the invention, the power connector (470) may include a blind-mate power connector or a standard wire plug power connector.

While FIG. 4 shows a power connector mechanism, any configuration of power connector mechanism at any location within the computing device (e.g., 200, FIG. 2) may be used to provide the required power to the heating or cooling component (e.g., 430A) to initiate heating or cooling process without departing from the invention. Those skilled in the art will appreciate that the heating or cooling component (e.g., 430A) may be supplied with power, directly or indirectly, via one or more power supplies (not shown) within the computing device (e.g., 200, FIG. 2).

In an embodiment of the invention shown in FIG. 4, the printed circuit board component (e.g., 420A) is affixed to the printed circuit board (450), where the heat sink (400) is affixed to the printed circuit board component (e.g., 420A). The heating or cooling component (e.g., 430A) is affixed to one of the side surfaces of the fin (e.g., 410A), and both the fin and the heating or cooling component are oriented orthogonally to the printed circuit board component (e.g., 420A).

In one embodiment of the invention, when a current temperature of the printed circuit board component (e.g., 420A) is below a threshold (e.g., if the operating temperature range is 0° C.-40° C., then the threshold may be −1° C.), the heating or cooling component (e.g., 430A) is powered along the heating power direction to heat the fin (e.g., 410A), and the induced heat is transferred from the fin to the printed circuit board component mostly via thermal conduction.

In one embodiment of the invention, when the current temperature of the printed circuit board component (e.g., 420A) is above a threshold (e.g., if the operating temperature range is 0° C.-40° C., then the threshold may be 41° C.), the heating or cooling component (e.g., 430A) is powered along a direction opposite to the heating power direction (e.g., by changing voltage polarity) to cool the fin (e.g., 410A) and the printed circuit board component primarily via thermal conduction. While any excess thermal energy is leaving the printed circuit board component (e.g., 420A) through the heat sink (400), this approach will further boost the thermal energy dissipation of the printed circuit board component.

In one embodiment of the invention, a resistive heater (not shown) and a cooler (not shown) can be affixed to one of the side surfaces of the fin (e.g., 410A), and the fin, resistive heater, and cooler can be oriented orthogonally to the printed circuit board component (e.g., 420A). When the current temperature of the printed circuit board component (e.g., 420A) is below a threshold (e.g., if the operating temperature range is 0° C.-40° C., then the threshold may be −1° C.), the resistive heater can be powered to heat the fin (e.g., 410A) and the induced heat can be transferred from the fin to the printed circuit board component (e.g., 420A) primarily via thermal conduction. Further, when the current temperature of the printed circuit board component (e.g., 420A) is above a threshold (e.g., if the operating temperature range is 0° C.-40° C., then the threshold may be 41° C.), the cooler can be powered to cool the fin (e.g., 410A) and the printed circuit board component primarily via thermal conduction.

In one or more embodiments of the invention, when the temperature of the printed circuit board component (e.g., 420A) is brought to its designed operating temperature range, the printed circuit board component may continue to operate in the harsh environmental conditions. When equilibrium operation conditions are present (e.g., the heating or cooling component (e.g., 430A) is off), the heat sink (400) can be used for its conventional purpose. For example, when necessary, any excess thermal energy may leave the printed circuit board component (e.g., 420A) through the heat sink (400), in which the surface area of the printed circuit board component is enlarged for faster thermal energy dissipation.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computing device, comprising:
   a heat dissipation component (HDC);
   a heating or cooling apparatus, wherein the HCA comprises a heating or cooling component (HCC), wherein the HCC is affixed to a first surface of the HDC;
   a resistive heater and a cooler,
      wherein the resistive heater is affixed to a second surface of the HDC, wherein the resistive heater is made of silicon rubber or polyimide film,
      wherein the cooler is affixed to a third surface of the HDC, wherein the cooler is made of the silicon rubber or the polyimide film; and
   a printed circuit board (PCB), wherein the PCB comprises a PCB component, wherein the HDC is affixed to the PCB component and configured to heat or cool the PCB component,
      wherein, when a first current temperature of the PCB component is below a first threshold, the HCC and the resistive heater are powered to heat the HDC and the PCB component, wherein the HCC is powered along a first direction to heat the HDC and the PCB component,
      wherein, when a second current temperature of the PCB component is above a second threshold, the HCC and the cooler are powered to cool the HDC and the PCB component, wherein the HCC is powered along a second direction to cool the HDC and the PCB component, wherein the second direction is opposite to the first direction.

2. The computing device of claim 1, wherein the HDC comprises a heat sink, wherein the HCC is affixed to a fin of the heat sink.

3. The computing device of claim 1, wherein the HDC comprises a base, wherein the HCC is affixed to the base of the HDC.

4. The computing device of claim 1, wherein the HDC, when heated by the HCC, transfers thermal energy to the PCB component.

5. The computing device of claim 1, wherein the HDC, when cooled by the HCC, transfers thermal energy away from the PCB component.

6. The computing device of claim 1, wherein the HDC comprises a pipe, wherein the pipe transfers thermal energy to a base of a heat sink.

7. The computing device of claim 1, wherein the HCC operatively connected to a power connector, wherein the HCC receives power via the power connector.

8. The computing device of claim 7, wherein the power connector is a blind-mate power connector.

9. The computing device of claim 1, further comprising:
   a temperature sensor, located within the computing device, operatively connected to a heating or cooling control component and configured to detect a temperature within the computing device,
   wherein the heating or cooling control component is configured to initiate the activation of the HCC based on the temperature within the computing device.

10. The computing device of claim 1, wherein the HCC is a thermoelectric cooler.

11. An information handling system, comprising:
    a cabinet housing a plurality of computing devices;
    the plurality of computing devices, wherein each of the computing devices comprises:
       a heat dissipation component (HDC);
       a heating or cooling apparatus (HCA), wherein the HCA comprises a heating or cooling component (HCC), wherein the HCC is affixed to a first surface of the HDC;
    a resistive heater and a cooler,
       wherein the resistive heater is affixed to a second surface of the HDC, wherein the resistive heater is made of silicon rubber or polyimide film,
       wherein the cooler is affixed to a third surface of the HDC, wherein the cooler is made of the silicon rubber or the polyimide film; and
    a printed circuit board (PCB), wherein the PCB comprises a PCB component, wherein the HDC is affixed to the PCB component and configured to heat or cool the PCB component,
       wherein, when a first current temperature of the PCB component is below a first threshold, the HCC and the resistive heater are powered to heat the HDC and the PCB component, wherein the HCC is powered along a first direction to heat the HDC and the PCB component,
       wherein, when a second current temperature of the PCB component is above a second threshold, the HCC and the cooler are powered to cool the HDC and the PCB component, wherein the HCC is powered along a second direction to cool the HDC and the PCB component, wherein the second direction is opposite to the first direction.

12. The information handling system of claim 11, wherein the HDC comprises a heat sink, wherein the HCC is affixed to a fin of the heat sink.

13. The information handling system of claim 11, wherein the HDC comprises a base, wherein the HCC is affixed to the base of the HDC.

14. The information handling system of claim 11, wherein the HDC, when heated by the HCC, transfers thermal energy to the PCB component.

15. The information handling system of claim 11, wherein the HDC, when cooled by the HCC, transfers thermal energy away from the PCB component.

16. The information handling system of claim 11, wherein the HDC comprises a pipe, wherein the pipe transfers thermal energy to a base of a heat sink.

17. The information handling system of claim 11, wherein the HCC operatively connected to a power connector, wherein the HCC receives power via the power connector.

18. The information handling system of claim 17, wherein the power connector is a blind-mate power connector.

* * * * *